(12) United States Patent
Saxena et al.

(10) Patent No.: US 9,195,607 B1
(45) Date of Patent: Nov. 24, 2015

(54) CONTENT MATCHING USING A MULTI-HASH FUNCTION FOR REPLACEMENT OF A FAULTY MEMORY CELL

(71) Applicant: Inphi Corporation, Santa Clara, CA (US)

(72) Inventors: Nirmal Saxena, Santa Clara, CA (US); Javier Villagomez, Santa Clara, CA (US)

(73) Assignee: Inphi Corporation, Santa Clara, CA (US)

( * ) Notice: Subject to any disclaimer, the term of this patent is extended or adjusted under 35 U.S.C. 154(b) by 356 days.

(21) Appl. No.: 13/791,161

(22) Filed: Mar. 8, 2013

Related U.S. Application Data

(60) Provisional application No. 61/647,054, filed on May 15, 2012.

(51) Int. Cl.
*G11C 29/00* (2006.01)
*G06F 12/10* (2006.01)
*G11C 7/10* (2006.01)

(52) U.S. Cl.
CPC .......... *G06F 12/1018* (2013.01); *G11C 7/1072* (2013.01)

(58) Field of Classification Search
CPC . G06F 17/30091; G06F 7/74; G06F 12/1408; G06F 12/145; G06F 21/575; G06F 21/79; G06F 12/1483; G06F 2212/171; G06F 2212/402; G06F 17/30949; G06F 12/02; G06F 3/0689; G06F 3/0641; G06F 3/0619; G06F 11/1076; G11C 15/00; G11C 29/76; G11C 29/44; H04L 63/18; H04L 9/3236; H04L 63/20; H04L 12/4625; H04L 45/7453; H04L 45/745; H04W 12/06; G11B 20/1816
See application file for complete search history.

(56) References Cited

U.S. PATENT DOCUMENTS

| | | | | |
|---|---|---|---|---|
| 4,538,240 A * | 8/1985 | Carter et al. | ................... | 708/492 |
| 6,804,767 B1 * | 10/2004 | Melvin | ......................... | 711/216 |
| 6,842,874 B1 * | 1/2005 | Voshell | ......................... | 714/723 |
| 2004/0255045 A1 * | 12/2004 | Lim et al. | ........................ | 709/245 |
| 2005/0141519 A1 * | 6/2005 | Rajgopal et al. | .......... | 370/395.32 |
| 2006/0233011 A1 * | 10/2006 | Matsuoka et al. | ............... | 365/49 |
| 2007/0294496 A1 * | 12/2007 | Goss et al. | ..................... | 711/163 |
| 2009/0106486 A1 * | 4/2009 | Kim et al. | ...................... | 711/103 |
| 2010/0023727 A1 * | 1/2010 | Lim | .............................. | 711/216 |
| 2012/0158674 A1 * | 6/2012 | Lillibridge | .................... | 707/692 |

OTHER PUBLICATIONS

Nirmal R. Saxena and Edward J. McCluskey, "Primitive Polynomial Generation Algorithms Implementation and Performance Analysis," Center for Reliable Computing, Technical Report, Apr. 2004, 31 pages, Standford University, Stanford, California.

* cited by examiner

*Primary Examiner* — Guerrier Merant
(74) *Attorney, Agent, or Firm* — Richard T. Ogawa; Ogawa P.C.

(57) ABSTRACT

A memory interface device comprising an address match table. The address match table includes a content entry input and a plurality of hash functions numbered from 1 through N, where N is an integer greater than 1. The address match table includes a first table comprising a plurality of lists numbered from 1 through N, each hash function (i) corresponds to a list (i), where (i) is a number in a set from 1 through N, and a second table coupled to the first table, the second table comprising a plurality of entries, each of the entries point to a different entry within the second table or a null entry in the second table. The interface device includes an index from list N in the first table points to the second table.

21 Claims, 10 Drawing Sheets

| Rank ID | Bank ID | Row Address | Column Address | | Spare ID |
|---|---|---|---|---|---|
| 0 | 3 | 0x0A81 | 0x00C1 | | 0 |
| 0 | 3 | 0x1BC1 | 0x01E0 | | 1 |
| 1 | 0 | 0x0C03 | 0x032D | | 1 |
| 1 | 1 | 0x0047 | 0x0004 | | 0 |
| 1 | 1 | 0x0161 | 0x00CC | | 0 |
| 1 | 2 | 0x1958 | 0x006E | | 0 |
| 1 | 2 | 0x04DA | 0x01E9 | | 1 |
| 1 | 3 | 0x098C | 0x000E | | 1 |

FIGURE 2

CONTENT MATCHING USING A MULTI-HASH FUNCTION FOR REPLACEMENT OF A FAULTY MEMORY CELL

CROSS-REFERENCES TO RELATED APPLICATIONS

The present application is claims priority to and incorporates by reference, for all purposes, the following patent application: U.S. Provisional Application No. 61/647,054 filed May 15, 2012, commonly assigned, and hereby incorporated by reference herein.

COPYRIGHT NOTICE

A portion of the disclosure of this patent document may contain material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice shall apply to this document: Copyright © 2013 Inphi Corporation.

BACKGROUND OF THE DISCLOSURE

The present invention relates generally to solid state memory techniques. More particularly, the present invention provides methods and devices for repairing a "bad memory cell" with a substitute cell for a memory device such as a dynamic random access memory ("DRAM") device or others.

In memory systems, two general classes of memories exist. Such classes include low latency memories. The low latency memories have effectively infinite endurance or usage-cycles and do not degrade with respect to age or repeated accesses. Additionally, such classes also include relatively longer latency memories that do not have infinite endurance or usage cycles, and may degrade with respect to age or repeated accesses. In the case of the relatively long latency memories, sophisticated multi-error detection and correction algorithms have been implemented to correct for data cells that can degrade over the lifetime of the device due to aging effects or repeated accesses. In the case of low latency memories such as DRAM devices, however, effectively infinite endurance or usage-cycles are assumed so once weak bits or bad bits are mapped out by the device manufacturer, no errors should occur due to degradation of data cells due to aging effects or repeated accesses.

As is known, the conventional DRAM memory cell has an access transistor and a storage capacitor. The access transistor connects with the storage capacitor to a bitline when switched-on such that the capacitor stores the logic value placed on the bitline. Due to the tendency of a capacitor to lose its charge over time, DRAM memory cells must be periodically 'refreshed', which serves to maintain the value stored in each storage capacitor at its desired value. The amount of time that a cell can retain its logic value is referred to as its "data retention time".

A trend in the development of memory cells is that the cells have been shrinking due to advancements in process technology and the demand for ever larger memory capacity. This necessarily results in a reduction in the sizes of the access transistor and storage capacitor, which can lead to several limitations. For example, each access transistor exhibits leakage which acts to slowly drain stored charge from the storage capacitor. This leakage characteristic—and thus each cell's data retention time—varies from transistor to transistor; however, this variability increases as the size of the access transistors is reduced. Another problem is that a shrinking memory cell results in a smaller storage capacitor, and thus a reduced storage capacitance. This can also adversely affect the data retention time characteristics of the cells.

BRIEF SUMMARY OF THE INVENTION

The present invention is related to memory devices for electronic applications. More specifically, embodiments of the present invention provide a memory interface device comprising an address match table and methods of operation, which can be implemented various computing devices, servers, and the like. Merely by way of example, these devices can be configured for or implemented as memory devices, such as SDRAM, DDR SDRAM, RDRAM, SRAM, and Flash devices, and the like. But it will be recognized that the invention as a much broader range of applicability.

In an embodiment, the present invention provides a memory interface device including an Address Match Table (AMT). This AMT includes a content entry input, a plurality of hash functions, a first table, a second table, and an index. The plurality of hash functions can be numbered from 1 through N, where N is an integer greater than 1. The first table, which is Table A, can include a plurality of lists numbered from 1 through N. Each has function (i) corresponds to a list (i), where (i) is a number in a set from 1 through N. The second table, which is Table B and includes a plurality of entries, can be coupled to the first table. Each of these entries can point to a different entry within the second table or a null entry in the second table. Furthermore, the index can be provided from list N in the first table that points to the second table.

In a specific embodiment, the hash functions numbered 1 through N can be derived from a set of N orthogonal Galois Field primitive polynomials. These Galois Field primitive polynomials can be configured using a logic gate circuitry including at least XOR logic gates, though other logic gates and combinations can be used. Also, the content entry input can receive address information comprising a bank/row address for a dynamic random access memory device. Furthermore, N can be determined as four (4) in a specific embodiment.

In a specific embodiment, the first table with the plurality of lists can be provided by a plurality of SRAM arrays. Each of these SRAM arrays can be numbered 1 through N, which can correspond to each of the numbered lists from 1 through N. The first table can be populated with a set of content entries as well. The second table can also be provided by an SRAM array. Each of the entries in the second table can have four content entries and have an index to a different entry or a null entry in the SRAM array.

In an embodiment, the present invention provides a method of operating a memory interface device including an address match table with a first and second table. This method can include providing a stream of address information into a content entry input receiver, transferring the address information, and simultaneously transform the address information using a plurality of hash functions numbered from 1 through N, where N is an integer greater than 1, into a plurality of list locations numbered from 1 through N.

In a specific embodiment, the method is a method for populating content entries in the AMT. This method can include populating the address information in to a first available list (i) that is the smallest (i) in a set of available lists numbered from 1 through N. If no available lists exist in the first table, then the method includes populating the address information into an entry in the second table coupled to the first table through an index from list N that points from the first table to the second table. If no available entry exists in the second table, then the method includes directing the address information to a different entry in the second table. The directing of the address information to another different entry can be continued in a successive manner until the address information is stored in the second table.

In a specific embodiment, the method is a method for looking up and matching content entries in the AMT. This method can include looking up the address information in a first available list (i) that is the smallest (i) in a set of available lists numbered from 1 through N. If no available lists exist in the first table, then the method includes looking up the address information from an entry in the second table coupled to the first table through an index from list N that points from the first table to the second table. If no available entry exists in the second table, then the method includes directing the address information to a different entry in the second table. The directing of the address information to another different entry can be continued in a successive manner until the address information matching is determined in the second table.

Many benefits are achieved by way of the present invention over conventional embodiments and techniques. For example, embodiments of a memory IC device can have improved performance and lifetime. Embodiments of a memory interface device can facilitate the "repair" of bad or faulty memory cells, or even undesirable memory cells due to aging, deterioration, or the like. Spare memory cells from a memory IC device can be rerouted via a memory interface device upon detection of predetermined characteristics of memory cell to be replaced. These implementations provide several means of maintaining or improving memory performance, which can be tailored depending on various hardware and/or software requirements of specific applications.

Various additional objects, features and advantages of the present invention can be more fully appreciated with reference to the detailed description and accompanying drawings that follow.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIG. 2 illustrates a simplified Address Match Table according to an embodiment of the present invention.

DETAILED DESCRIPTION OF SPECIFIC EMBODIMENTS OF THE DISCLOSURE

A trend in the development of memory storage devices is that as the storage cells continue to shrink due to advancements in process technology, storage cells in low latency memories such as DRAM devices may become more susceptible to errors that occur due to aging effects or repeated accesses. Moreover, the number of weak bits due to natural process variations will continue to increase. Accordingly, it is desirable that spare storage cells can be utilized to correct for the presence of faulty storage cells in low latency memory that may develop over the lifetime of the device.

The present invention is related to memory devices for electronic applications. More specifically, embodiments of the present invention provide memory interface devices and memory IC (integrated circuit) devices, which can be implemented various computing devices, servers, and the like. Merely by way of example, these devices can be configured for or implemented as memory devices, such as SDRAM, DDR SDRAM, RDRAM, SRAM, and Flash devices, and the like. But it will be recognized that the invention as a much broader range of applicability.

A system and method are provided for replacing faulty or weak memory storage cells in a memory system through the use of an enhanced memory interface circuit or enhanced memory controller device and the use of redundant memory storage cells.

The present invention provides for a method that may be implemented in different ways for different systems. An implementation is described herein as an illustrative example. The example should not be construed as limiting the scope of the claims according to the present invention.

In an example, the present techniques provide for support of weak cell management in DRAM devices. It is believed that as DRAM process technology continue to advance, DRAM cell storage capacitance will continue to decrease and more and more DRAM storage cells will be unable to meet specified data retention time requirements. Furthermore, as the number of weak DRAM storage cell increases, DRAM devices as a whole will be unable to provide sufficient number of redundant rows and redundant columns to continue to effect repairs and present the façade of perfect storage devices. According to the present example, the techniques provide logic devices coupled with DRAM memory cells to help healing ailing DRAM devices and mitigate the ill effects of the weak DRAM cells. Further details of the present system and method can be found throughout the present specification and more particularly below.

EXAMPLE

Figure 1:
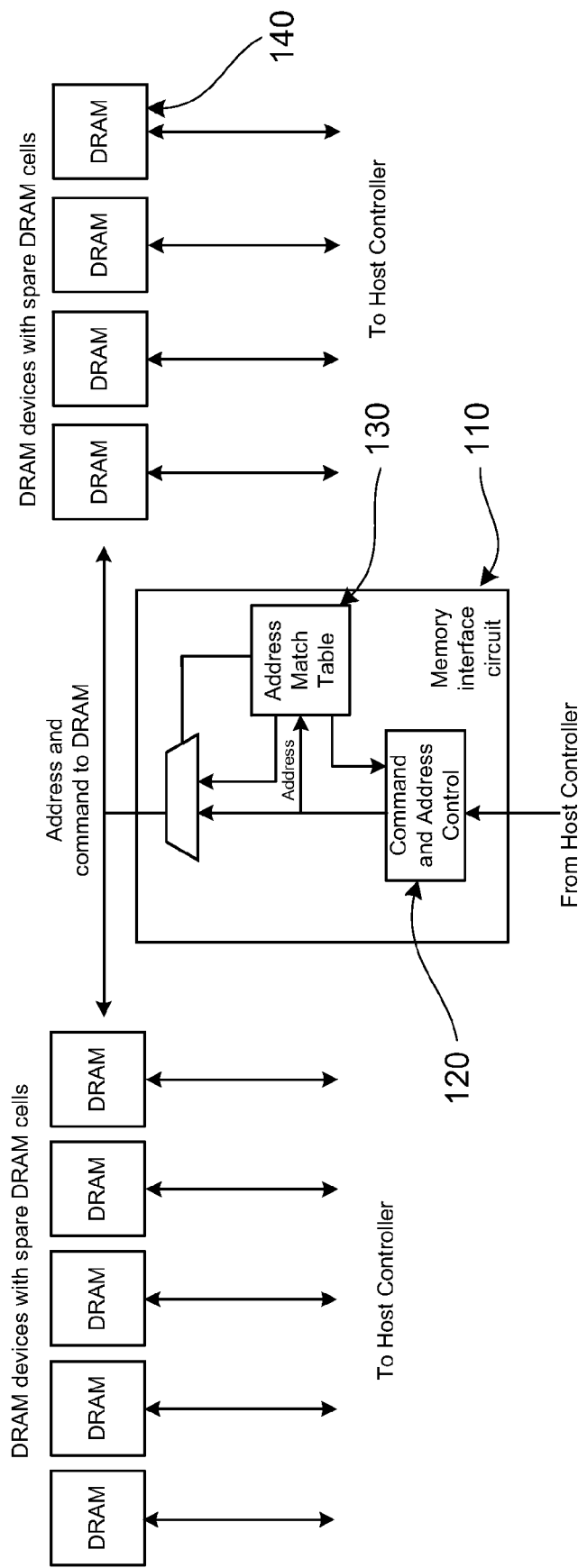
FIG. 1 illustrates a simplified block diagram of an interface circuit according to an embodiment of the present invention.

Utilizing an Address Match Table in Memory Interface Circuit, Controlling Spare Memory Storage Cells to Dynamically Replace Faulty Storage Cells in Memory Devices, as illustrated by FIG. 1.

FIG. 1 shows an example of use of an enhanced interface circuit that, in combination with spare cells in DRAM devices, can function to replace faulty memory locations in the DRAM devices. In FIG. 1, an enhanced memory interface circuit, labeled as 110 is shown to contain a command and address control unit, labeled as 120, and an Address Match Table, labeled as 130. The enhanced memory interface circuit re-drives addresses and commands from the host controller to the DRAM devices, one of which is labeled as 140 in FIG. 1. The DRAM devices contain spare DRAM cells, the addresses of which the enhanced memory interface circuit can select and effect the replacement of faulty or weak storage cell locations, as illustrated by the Table in FIG. 2.

As an example, the DRAM device may include a plurality of memory cell arrays, a plurality of switch blocks, and a plurality of sensing amplifying units. Each of the memory cell arrays includes at least one memory cell, and each memory cell may be connected to a word line and a bit line. Of course, other features exist with the DRAM device.

FIG. 2 shows an example of the Address Match Table, labeled as 130 in FIG. 1. FIG. 2 shows that the Address Match Table contains addresses of faulty memory storage cells. In the case of FIG. 2, the addresses are listed in terms of DRAM address formats: Rank ID, Bank ID, Row Address and Column Address. The reference spare ID can be "0" or "1," although there can be variations. The spare ID may be used to indicate data bus offset as to select subset(s) of DRAM devices to respond to the selection of a spare location. For example, the offset ID may indicate, for example, that: only the left side of the memory module should be matched against the bad memory address, only the right side of the memory module should be matched against the bad memory address, the entire width (one rank) of the memory module should be matched against the bad memory address, or a single DRAM device should be matched against the bad memory address.

In other implementations, address fields for Chip ID (CID) and Bank Group ID may also be used. The addresses of faulty or weak memory storage cells contained in the Address Match Table may be determined by testing during manufacturing or special run-time testing. The entries in the Address Match Table may also be dynamically updated during runtime if it is determined that additional memory storage locations are weak or faulty. The function of the Address Match Table is to act as a filter of addresses and commands that flow through the enhanced memory interface circuit 110. In the case that a given memory access is matched to an entry in the Address Match Table, the Address Match Table replaces the address of the memory access with the address of a spare memory location. In this manner, the existence of the faulty or weak memory address is hidden from the host memory controller, and the enhanced memory interface circuit enables the memory devices to present a contiguous memory address space without faulty or weak cell locations, as shown in FIG. 3.

Figure 3:
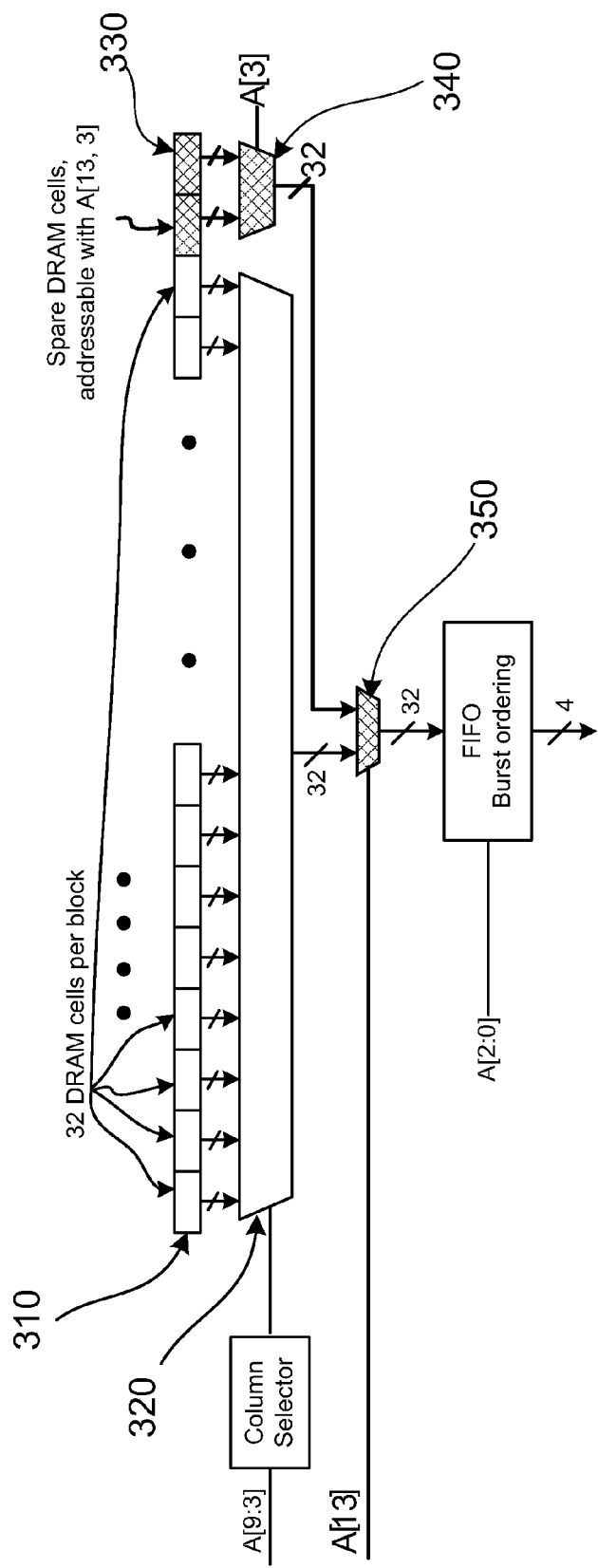
FIG. 3 illustrates a simplified diagram of spare memory cells in a DRAM device according to an embodiment of the present invention.

FIG. 3 shows an exemplary implementation of spare memory cells in a DRAM device. The spare memory storage cells are arranged in terms of added columns for each row. FIG. 3 shows a row of DRAM storage cell organized as blocks, with 32 DRAM cells per block. A block of 32 DRAM storage cells is labeled as 310 in FIG. 3. FIG. 3 also shows that in the exemplary DRAM device, column addresses A [9:3] are used to select between different blocks of DRAM storage cells through a block of circuits collectively labeled as a large multiplexor. The large multiplexor is labeled as 320 in FIG. 3. FIG. 3 also shows the implementation of two blocks of spare DRAM cells, labeled as 330. FIG. 3 further illustrates that the two blocks of spare DRAM cells can be separately selected through the use of the column address A[3] through a multiplexor circuit labeled as 340. Finally, the column address A[13] can be used to select between data from the baseline memory array or data from the spare memory cells through the multiplexor labeled as 350 in FIG. 3.

To prove the principle and operation of the present techniques, examples have been prepared. These examples are merely for illustration purposes and should not unduly limit the scope of the claims herein. One of ordinary skill in the art would recognize many variations, alternatives, and modifications.

To assist the reader, the following terms are defined as examples.

AMT: Address Match Table
CID: Chip ID
IFR: In-Field Repair
LRDIMM: Load-Reduced Dual Inline Memory Module
MB: Memory Buffer
MemBIST: Software tool to generate built in self test blocks for a memory matrix as a
VHDL model for the whole memory system.
RCD: Registering Clock Driver, Also known more simply as the "Register"
RDIMM: Registered Dual Inline Memory Module
RID: Rank ID
SPD: Serial Presence Detect
VRT: Variable Retention Time
WBA: Weak Bit Address
WBAL: Weak Bit Address List
WCM: Weak Cell Management In an example, techniques include a method that is provided within a framework wherein DRAM devices are characterized, weak cells within the DRAM devices are detected, their address locations stored in non-volatile memory locations, and the subsequent usage of the Weak Bit Address list to effect dynamic repairs that are transparent to the host memory controller. The section on MemBIST will provide descriptions of testing algorithms to detect weak cells, and the section on Weak Bit Address List storage format will specify their storage format in non-volatile memory, and the sections that describe specific repair concepts will detail the usage of the Weak Bit Address List to effect weak cell management.

In an example, the present description provides a high level architectural specification that is independent of specific DRAM types, specific DIMM types, and specific weak bit replacement concepts. It is intended that this specification will act as the master specification from which an implementation-specific architectural specification may be quickly derived.

In an example, the Externally-Addressable-Spare-Columns-in-DRAM concept is designed for implementation on a DDR3 or DDR4 Register DIMM (RDIMM) or LRDIMM. The Externally-Addressable-Spare-Columns-in-DRAM concept also utilizes a known Weak Bit Address List (WBAL) stored in one or more Address Match Tables (AMT) to compare against addresses of DRAM commands that flow through the Address and Command Path of the RDIMM or LRDIMM. In the case that a match to a known Weak Bit Address, the Address Match Table replaces the column-address of the Column-Access command with a column-address to a set of spare columns in the DRAM devices. The spare-columns are used to provide reliable storage locations for data in place of columns with known faulty or weak DRAM storage cells.

Figure 4:
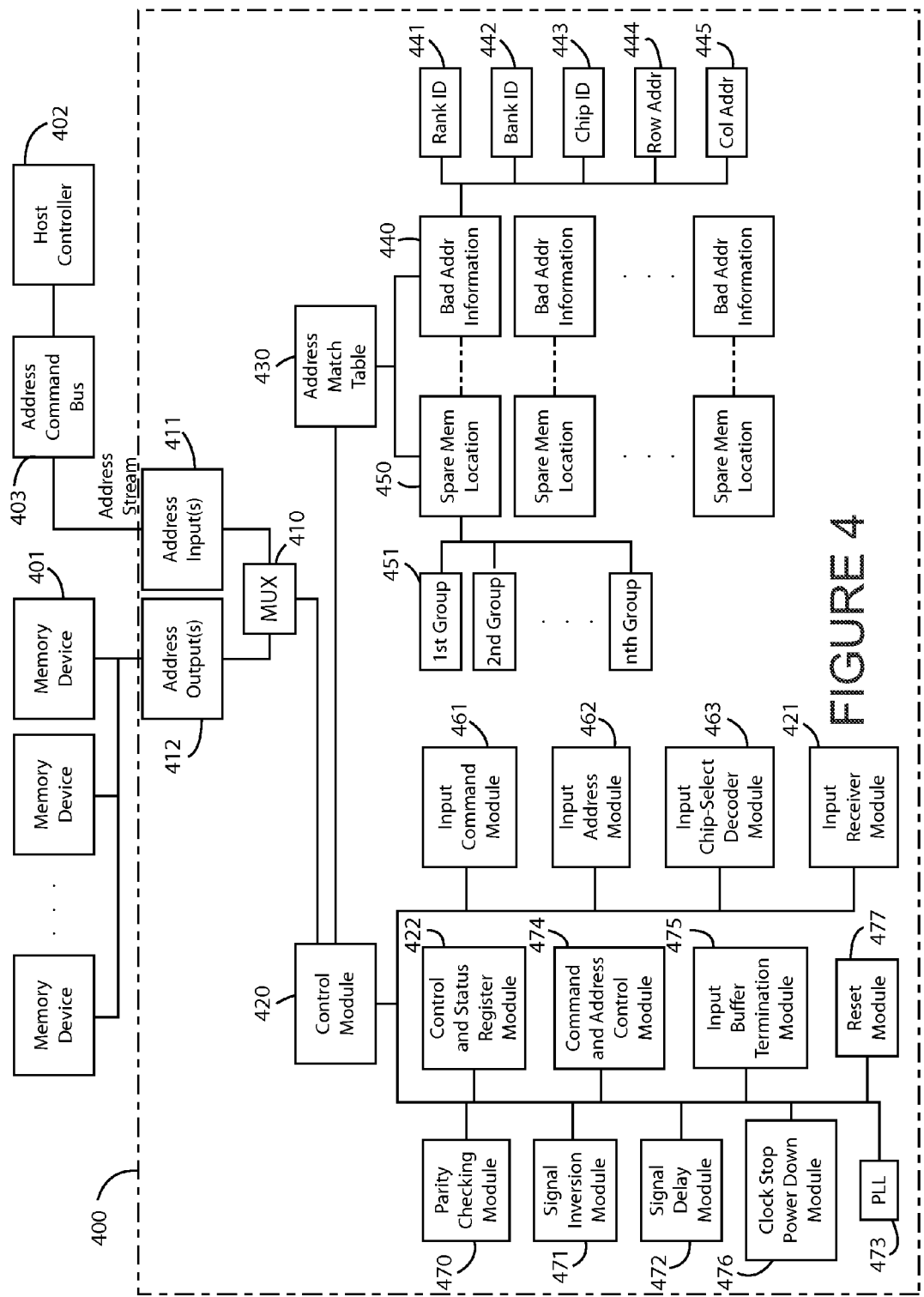
FIG. 4 illustrates a simplified block diagram of a memory interface device according to an embodiment of the present invention.

In an example, FIG. 4 illustrates a DDR4 Registered DIMM where the DDR4 Register has been modified to incorporate one or more Address Match Tables. The Address Match Tables check addresses of DRAM commands as the DRAM commands flow through the DDR4 Register against known Weak Bit Address locations. In the case of an address match, the DDR4 Register dynamically replaces the column-address of the column-access command with the address of a spare column in DRAM devices.

To facilitate the implementation of the Spare-Columns-in-DRAM concept the architectural description of the Address Match Table and Externally-Addressable-Spare-Columns-in-DRAM may be found in the following sections (1) Address Match Table; (2) Externally-Addressable-Spare-Columns-in-DRAM.

In an embodiment, the present invention provides a memory interface device. As shown in FIG. 4, the device 400 can include address input(s) 411, address output(s) 412, an address match table 420, a control module 430, and a multiplexer 410. In a specific embodiment, the memory interface device 400 can be selected from a register device, a buffer device, an advanced memory buffer, a buffer on-board, or the like and combinations thereof The address input(s) 411 can be configured to receive address information from an address stream of a host controller, while the address output(s) 412 can be coupled to a plurality of memory devices and be configured to drive address information. In a specific embodiment, the plurality of memory devices 401 can include a plurality of DRAM devices, Flash devices, or other like memory devices. Furthermore, the multiplexer 410 can be coupled to the address input and the address output.

The address match table 430 can include an array of SRAM cells, or the like. In a specific embodiment, this address match table 430 can include a plurality of bad address information 440 and a plurality of spare memory locations 450. Each of the plurality of bad address information 440 can be associated with one of the plurality of spare memory locations 450. Each of the plurality of bad address information can include a rank ID 441, a bank ID 442, a chip ID 443, a row address 444, and a column address 445. Additional parameters can also be included. Each of the plurality of spare memory locations can include a plurality of memory groups 451, which can include a first column, second column, and an nth column. Row and bank configurations can also be used, as various numbers and configurations of spare memory locations can be used depending on design and related applications. The address match table can be configured to receive bad address information and can be configured to transfer the spare memory location to replace the bad address associated with the bad address information.

The control module 420 can be a command and address module, or the like. This control module 420 can be integrated with the address match table. In a specific embodiment, this control module 420 can be configured to determine address information from an address stream from an address command bus 403 coupled to a host controller 402 during a run time operation. This control module 420 can be configured to compare each address from the address steam and configured to determine whether each address matches with a stored address in the address match table 430 to identify a bad address. The control module 420 can also be configured to replace the bad address with the revised address of the spare memory location 450.

In a specific embodiment, the control module 420 can include an input receiver module 421 or a control and status register module 422. The control module can also include an input command 461, an input address 462, and an input chip-select decoder module 463. Other components, such as a parity checking module 470, a signal inversion module 471, a signal delay module 472, a PLL (Phase-locked loop) 473, a command and address control module 474, an input buffer termination module 475, a clock stop power down module 476, a reset module 477, and the like, can also be included with the memory interface device 400.

In a specific embodiment, the memory interface device can be coupled to a plurality of DRAM devices. Each of these DRAM devices can include a plurality of address inputs, a plurality of control inputs, a plurality of data input/outputs, a plurality of memory arrays, and a spare group. Each of the plurality of memory arrays can include a plurality of memory cells, each of which can be coupled to a data input/output. The spare group can include a plurality of spare memory cells. Each of these spare memory cells can be externally addressable using the address match table. Furthermore, the spare group can include a spare row, a spare column, or a spare bank.

Figure 5:
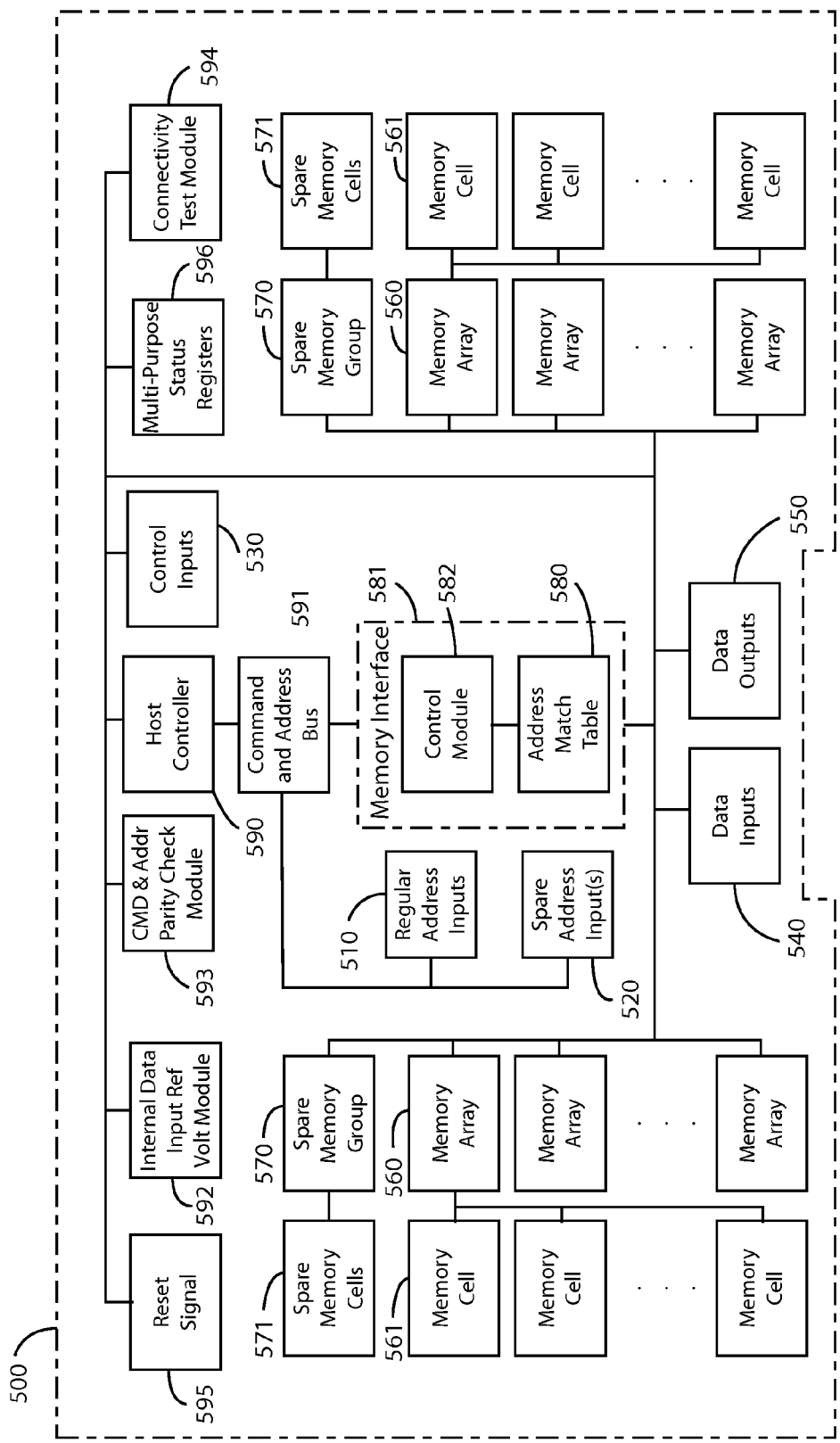
FIG. 5 illustrates a simplified block diagram of a memory integrated circuit device according to an embodiment of the present invention.

FIG. 5 illustrates a simplified block diagram of a memory integrated circuit device according to an embodiment of the present invention. As shown, this device 500 can include a plurality of regular address inputs 510, at least one spare address 520 configured for a selected mode or an unselected mode, a plurality of control inputs 530, a plurality of data inputs 540, a plurality of data outputs 550, a plurality of memory arrays 560, and a spare group of memory cells 570.

In a specific embodiment, each of the plurality of memory arrays 560 can include a plurality of memory cells 561. Each of these memory cells can be coupled to a data input/output 540/550. Also, the spare group of memory cells 570 can include a plurality of spare memory cells 571. The spare group of memory cells 571 can include a spare column, a spare row, a spare bank, or the like. Each of these memory cells 571 can be externally addressable using an address match table 580 and can be configured with the spare address input 520. The spare address input 520 can be coupled to the address match table 580 to access the spare memory cells 571. The address match table 580 can be provided within a memory interface device 581 with a control module 582. This memory interface 581 can be similar to that described for FIG. 4 above. In a specific embodiment, the spare address input 520 can include one of three unused column address inputs A11, A13, and A17.

In a specific embodiment, the plurality of spare memory cells 571 can be accessed from the group of memory cells 570 using the spare address input 520 during the selected mode. During a read operation, data from the accessed spare memory cell 571 can be transferred to one of the plurality of data outputs 550. During a write operation, data from one of the plurality of data inputs 540 can be transferred into the accessed spare memory cell 571. During the unselected mode, the spare address input 520 can remain inactive while the plurality of regular address inputs 510 remains active.

Also, the spare group of memory cells 570 can include various configurations of spare columns and spare address inputs. For example, the spare group 570 can include first through seventh spare columns, and the spare address input can include first through third spare address inputs. Or, the spare group can include first through third spare columns, and the spare address input can include a first and second spare address input. Other variations, modifications, and alternatives to these configurations can be used.

The memory integrated circuit device 500 can also include an encoded command and address bus 591 having a shared command signal and an address signal, an internal data input reference voltage circuit 592, a command and address parity checking circuit 593 a set of circuits designed to support connectivity testing 594, a reset input signal 595, a set of multi-purpose status registers 596 configured to be read out, or the like and combinations thereof. These modules and circuits can be coupled to a host controller 590. Those of ordinary skill in the art will recognize other variations, modifications, and alternatives.

Many benefits are achieved by way of the present invention over conventional embodiments and techniques. For example, embodiments of a memory IC device can have improved performance and lifetime. Embodiments of a memory interface device can facilitate the "repair" of bad or faulty memory cells, or even undesirable memory cells due to aging, deterioration, or the like. Spare memory cells from a memory IC device can be rerouted via a memory interface device upon detection of predetermined characteristics of memory cell to be replaced. These implementations provide several means of maintaining or improving memory performance, which can be tailored depending on various hardware and/or software requirements of specific applications.

In an example, the present invention provides a method for operating a memory interface device, as outlined below.

1. Receive, at an address input(s) of a memory interface device, address information from an address stream of a host computer; (step 610)
2. Process the address stream from an address command bus coupled to the host controller during a run time operation; (step 620)
3. Compare successively each address from the address stream from information in an address match table to determine to whether an address matches with a stored address in an address match table; (step 630)
4. Identify a bad address provided in the address match table; (step 640)
5. Replace the bad address with a revised address of a spare memory location; (step 650)
6. Transfer the revised address to a multiplexer coupled to the address output; (step 660)
7. Drive address information from an address output(s) of the memory interface device to a plurality of memory devices; (step 670) and
8. Perform other steps, as desired. (step 680)

As shown, the present method has a sequence of steps, which can be varied, modified, replaced, reordered, expanded, contracted, or any combinations thereof. That is, the method repeats any of the above steps. Such steps may be performed alone or in combination with others, which are described or not even described. The steps can be performed in the order shown or in other orders, if desired. The steps also can be performed using a combination of hardware and software using other process steps. The steps also can be performed using hardware or other processes implemented using software and the like. Of course, there can be many other variations, modifications, and alternatives. Further details of the present method can be found throughout the present specification and more particularly below.

Figure 6:
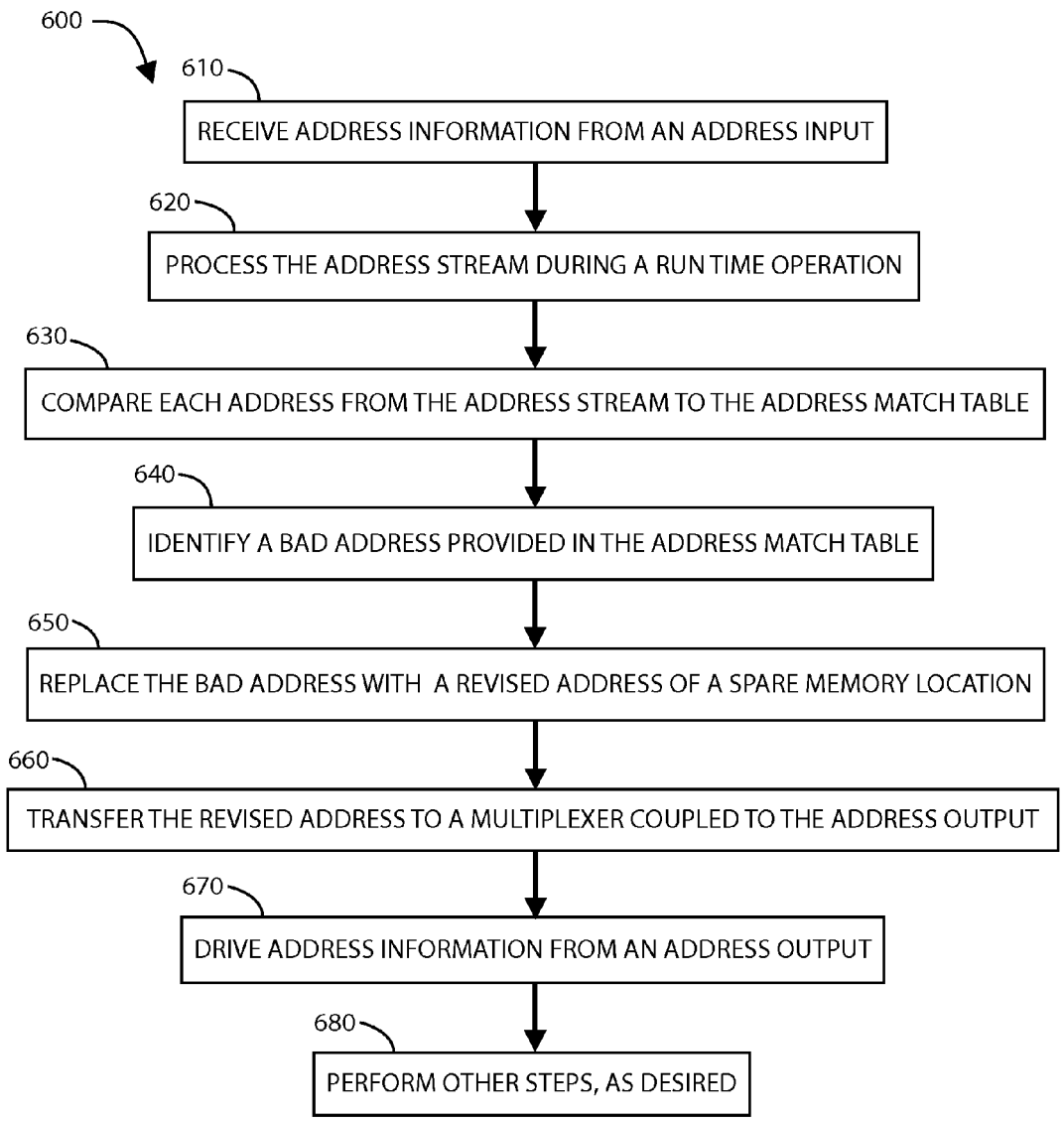
FIG. 6 illustrates a simplified flow diagram for operating the Address Match Table according to an embodiment of the present invention.

FIG. 6 illustrates a simplified flow diagram for operating an address match process for replacing a bad cell with a spare cell according to an embodiment of the present invention. As shown, method 600 can begin with receiving, at address input or inputs of a memory interface device, address information from an address stream of a host computer, step 610. This memory interface device can be coupled to a host computer.

The memory interface device can be selected from a register device, a buffer device, an advanced memory buffer, or a buffer on-board. These memory devices can include a plurality of DRAM devices, Flash devices, or other like devices and combinations thereof.

During a run time operation, the address stream from an address command bus coupled to the host controller can be processed, step 620. Each address from the address stream can be compared successively to determine whether an address matches with a stored address in an address match table, step 630. The address table can include a plurality of SRAM cells and can include a plurality of bad address information and a plurality of spare memory locations. Each of these bad address locations can be associated with one of the spare memory locations. Each of the bad address information can include a rank ID, a bank ID, a chip ID, a row address, and a column address. Each of the spare memory locations can include one or more memory groups, which can include columns, rows, or banks, and the like. In a specific embodiment, each of the spare memory locations can include a first, second, and an nth column.

A bad address in the address match table can be identified, step 640, and can be replaced with a revised address of a spare memory location, step 650. The revised address can be transferred to a multiplexer coupled to the address output, step 660. The address match table can be configured to receive bad address information and transfer the spare memory location to replace the bad address associated with the bad address information. Also, method 600 can include driving address information from an address output or outputs of the memory interface device to a plurality of memory devices, step 670.

In a specific embodiment, the comparing, identifying, and replacing can be under control of a control module. This control module can be integrated with the address match table and can further include an input receiver module, a control and status register module, an input command module, and input address module, and an input chip-select decoder module, and other like modules. Further details regarding components of these devices and process are described previously for FIGS. 1-5. Furthermore, other steps can be performed as desired according to various specifications and applications, step 680. Further details of an address lookup technique can be found throughout the present specification and more particularly below.

In an embodiment, the present invention provides architecture for storing and retrieving a fixed list of content entries in a space, power, and performance efficient manner. This fixed list can have a size ranging anywhere from thousands of content entries to an upper limit determined by the practicality of software and/or hardware implementations. The content entries of these lists, which can include a tuple (key, value), are of fixed or variable length binary digit strings. The size of these content entries is in hundreds of bits and the upper limit is also determined by the implementation constraints. Those of ordinary skill in the art will recognize other variations, modifications, and alternatives.

In silicon hardware, Content Addressable Memory (CAM) architectures are used to efficiently store and retrieve content entries. CAMs are used in microprocessors for fast address translations lookup and in network routing processors for Internet Protocol (IP) address search engines. However, if the number of content entries to be stored for matching is in the tens of thousands, then CAMs become impractical and expensive, both in terms of silicon area and power.

In microprocessors, set associative caches are used for this large number of content entries. Set-associative caches are very efficient in dynamically storing and retrieving program instructions or data. In other words, computer programs reference billions of instructions/data during run time and the set associative caches temporarily cache these references. Generally, the set associative caches have tens of thousands of locations for content storage. The effectiveness of set associative caches stems from the following fact: during small temporal bursts of instruction or data references include only a few thousand references that have spatial or temporal locality.

In some applications, the number of content entries is fixed and arbitrary with no spatial or temporal locality. In this case, the set associative caches will be inefficient. In other words, the amount of storage required to store may far exceed the actual storage required for the number of content entries. This is because more sets are allocated to resolve conflict misses. Simulations have indicated that there is about 25% efficiency in set-associative caches for randomly generated fixed-size content entry lists.

One of the program areas in a set-associative cache is that the ways are all associated with a set-index generated by a single hash function. In the present invention, the ways from one set-index to multiple set indexes can be decoupled. Multiple set indexes can be generated by different hash functions. For cases where the sets and ways cannot accommodate content entries, another structure based on a coalesced-chain index can be used. This combination of multiple hash functions, set-associativity, and coalesced chain indexing can accomplish greater than 96% efficiency for content entry sizes up to hundreds of thousands with lookup efficiency in less than tens of cycles.

Figure 7:
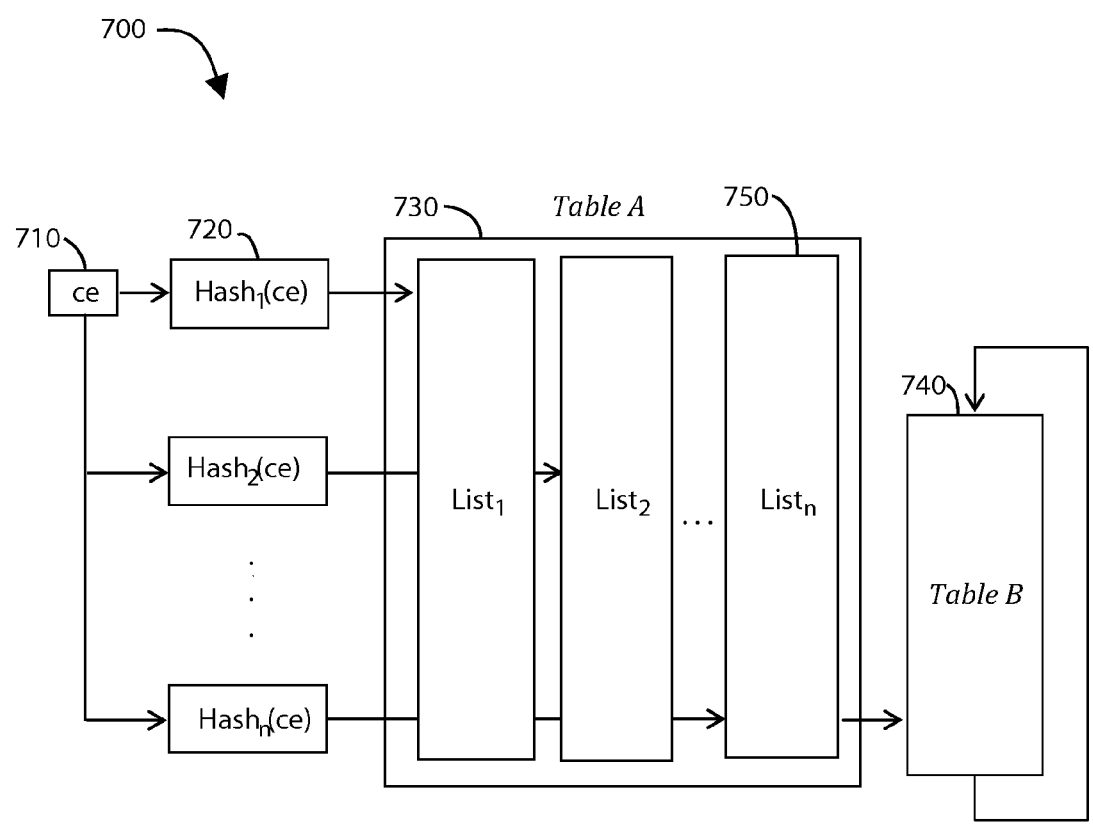
FIG. 7 illustrates a simplified block diagram of an address match table according to an embodiment of the present invention.

FIG. 7 illustrates a simplified block diagram of an address match table according to an embodiment of the present invention. As shown, the table 700 includes a content entry input 710, a plurality of hash functions 720, a first table 730, a second table 740, and an index 750. The plurality of hash functions 720 can be numbered from 1 through N, where N is an integer greater than 1. The first table 730, which is Table A, can include a plurality of lists numbered from 1 through N. Each has function (i) corresponds to a list (i), where (i) is a number in a set from 1 through N. The second table 740, which is Table B and includes a plurality of entries, can be coupled to the first table. Each of these entries can point to a different entry within the second table or a null entry in the second table. Furthermore, the index 750 can be provided from list N in the first table that points to the second table.

In a specific embodiment, the hash functions numbered 1 through N can be derived from a set of N orthogonal Galois Field primitive polynomials. These Galois Field primitive polynomials can be configured using a logic gate circuitry including at least XOR logic gates, though other logic gates and combinations can be used. Also, the content entry input 710 can receive address information comprising a bank/row address for a dynamic random access memory device. Furthermore, N can be determined as four (4) in a specific embodiment.

In a specific embodiment, the first table 730 with the plurality of lists can be provided by a plurality of SRAM arrays. Each of these SRAM arrays can be numbered 1 through N, which can correspond to each of the numbered lists from 1 through N. The first table 730 can be populated with a set of content entries as well. The second table 740 can also be provided by an SRAM array. Each of the entries in the second table 740 can have four content entries and have an index to a different entry or a null entry in the SRAM array.

In various embodiments, the architecture of the table 700 for storing and retrieving content entries can have the following salient features:

The architecture has a plurality of n hash functions (n>1): $Hash_1( ), \ldots, Hash_n( )$. Each hash function operates on the content key and produces r bit set index in the range [0 to $2^r-1$].

The architecture has two table structures: Table A and Table B. Table A has n fixed length lists of $2^r$ content entries: $List_1, \ldots, List_n$. $List_n$ is special in that each of its location has a pointer of fixed k-bit width which points to a set index in the range [0 to $2^k-1$] specifying locations in Table B.

The location in Table B pointed by the set index generated by Table A has up to m content entries as well as a k-bit pointer to the next chained location in Table B.

This k-bit pointer provides a coalesced-chain index.

The storing of a new content entry, ce, follows these steps:

Using the content entry ce, n simultaneous set indexes: $Hash_1(ce), \ldots, Hash_n(ce)$ are computed.

The n hash indexes $Hash_1(ce), \ldots, Hash_n(ce)$ respectively read out the n list entries $List_1, \ldots, List_n$. That is, $Hash_i(ce)$ index is used to read out the corresponding $List_i$. Note that the read out List, entry provides a pointer to Table B that is conditionally used based on the outcome of reading out $List_1, \ldots, List_n$. The read out list entry locations indicate whether there is available space for entry ce or if the location is already occupied by another content entry.

The content entry ce is stored (only in one location) in the first available space starting in the preference order of $List_1$ through $List_n$.

If there is no available space the content entry ce using the $List_n$ pointer to Table B is stored in the first available location in Table B by following the coalesced-chain indexing.

The matching or lookup of a content entry ce follows similar steps as storing a new entry:

Using the content entry ce, n simultaneous set indexes: $Hash_1(ce), \ldots, Hash_n(ce)$ are computed.

The n hash indexes $Hash_1(ce), \ldots, Hash_n(ce)$ respectively read out the n list entries $List_1, \ldots, List_n$. That is, $Hash_i(ce)$ index is used to read out the corresponding $List_i$. Note that the read out $List_n$ entry provides a pointer to Table B that is conditionally used based on the outcome of reading out $List_1, \ldots, List_n$.

There are two outcomes from the read out values: (1) exactly one of the read out entry from $List_1, \ldots, List_n$ matches ce, or (2) none of the read out entries match ce.

If there is no matched entry from step (c) then Table B is traversed staring with the pointer (provided by $List_n$) and follows the coalesced-chain index until a matching entry is found.

Figure 8:
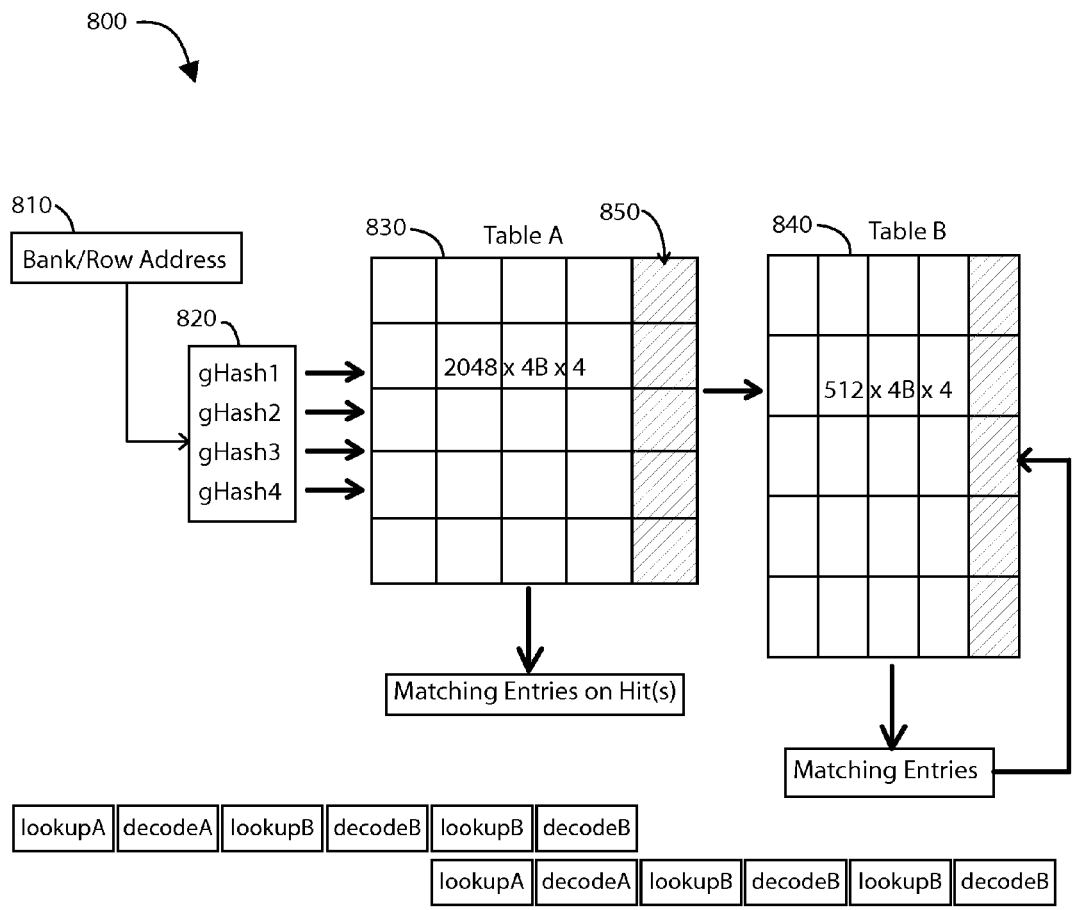
FIG. 8 illustrates a simplified block diagram of an address match table according to an embodiment of the present invention.

FIG. 8 illustrates a simplified block diagram of an address match table according to an embodiment of the present invention. As shown, the table 800 includes a content entry input 810, a plurality of hash functions 820, a first table 830, a second table 840, and an index 850. Further details regarding these elements can be found previously in the description of similar elements for FIG. 7.

In an embodiment, table 800, which can be an Address Match Table (AMT), can be implemented in silicon as shown in FIG. 8. The AMT can store a list of defective bank, row and column addresses of a DRAM memory. In this context, the content key is the bank/row address and the content value is the column address. The four hash functions labeled gHash1 through gHash4 can be based on Galois Field degree 11

(r=11) primitive polynomials. These primitive polynomials can be generated by methods described in Saxena, Nirmal R. & McCluskey, Edward J. (2004), "Primitive Polynomial Generation Algorithms Implementation and Performance Analysis". The first table 830, or Table A, has four lists with each list entry having a four-byte capacity and a list length of 2048. Each entry in list4 also has a 9-bit (k=9) pointer to the second table 840, or Table B. Table B is a coalesced chain indexed structure where each location has up to four content entries and a pointer to the next entry in the chain. In this embodiment, the content entry matching can be done in up to three lookups and new requests can be processed every four cycles.

Figure 9:
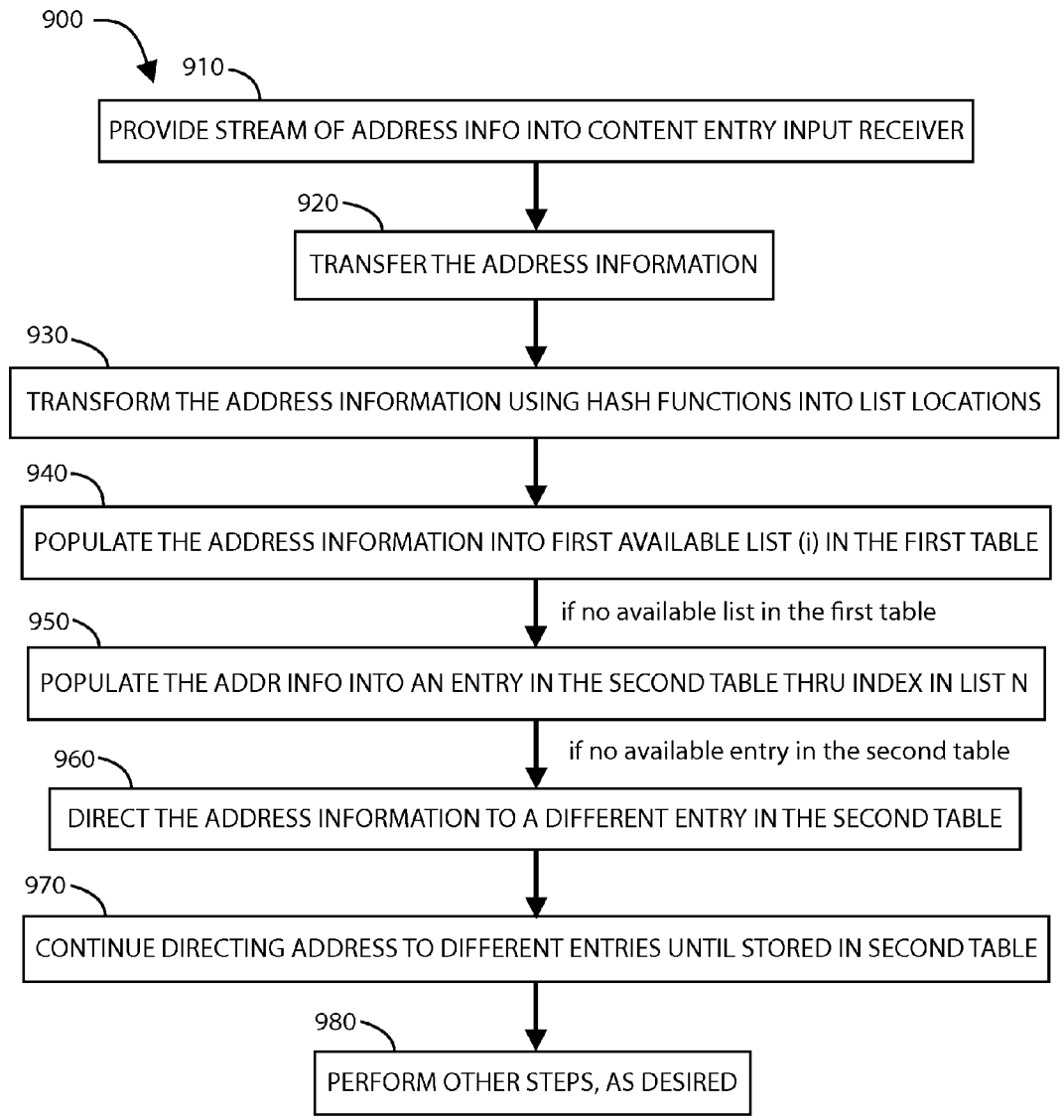
FIG. 9 illustrates a simplified flow diagram for operating the Address Match Table according to an embodiment of the present invention.

FIG. 9 illustrates a simplified flow diagram for operating the Address Match Table (AMT) according to an embodiment of the present invention. As shown, method 900 represents a method of populating the AMT with content entries. In an example, this method 900 for operating a memory interface device including an address match table with a first and second table is outlined below.

1. Provide a stream of address information into a content entry input receiver; (step 910)
2. Transfer the address information; (step 920)
3. Simultaneously transform the address information using a plurality of hash functions numbered from 1 through N, where N is an integer greater than 1, into a plurality of list locations numbered from 1 through N; (step 930)
4. Populate the address information in to a first available list (i) that is the smallest (i) in a set of available lists numbered from 1 through N, or if no available lists exist in the first table, thereafter; (step 940)
5. Populate the address information into an entry in the second table coupled to the first table through an index from list N that points from the first table to the second table, or if no available entry exists in the second table, thereafter; (step 950)
6. Direct the address information to a different entry in the second table; (step 960)
7. Continue the directing of the address information to another different entry in a successive manner until the address information is stored in the second table; (step 970) and
8. Perform other steps, as desired. (step 980)

In an embodiment, the AMT includes a content entry input, a plurality of hash functions, a first table, a second table, and an index, as described previously for FIGS. 7 and 8. The plurality of hash functions can be numbered from 1 through N, where N is an integer greater than 1. The first table, which is Table A, can include a plurality of lists numbered from 1 through N. Each has function (i) corresponds to a list (i), where (i) is a number in a set from 1 through N. The second table, which is Table B and includes a plurality of entries, can be coupled to the first table. Each of these entries can point to a different entry within the second table or a null entry in the second table. Furthermore, the index can be provided from list N in the first table that points to the second table.

In a specific embodiment, the hash functions numbered 1 through N can be derived from a set of N orthogonal Galois Field primitive polynomials. These Galois Field primitive polynomials can be configured using a logic gate circuitry including at least XOR logic gates, though other logic gates and combinations can be used. Also, the content entry input can receive address information comprising a bank/row address for a dynamic random access memory device. Furthermore, N can be determined as four (4) in a specific embodiment.

In a specific embodiment, the first table with the plurality of lists can be provided by a plurality of SRAM arrays. Each of these SRAM arrays can be numbered 1 through N, which can correspond to each of the numbered lists from 1 through N. The first table can be populated with a set of content entries as well. The second table can also be provided by an SRAM array. Each of the entries in the second table can have four content entries and have an index to a different entry or a null entry in the SRAM array.

As shown, the present method has a sequence of steps, which can be varied, modified, replaced, reordered, expanded, contracted, or any combinations thereof. That is, the method repeats any of the above steps. Such steps may be performed alone or in combination with others, which are described or not even described. The steps can be performed in the order shown or in other orders, if desired. The steps also can be performed using a combination of hardware and software using other process steps. The steps also can be performed using hardware or other processes implemented using software and the like. Of course, there can be many other variations, modifications, and alternatives.

Figure 10:
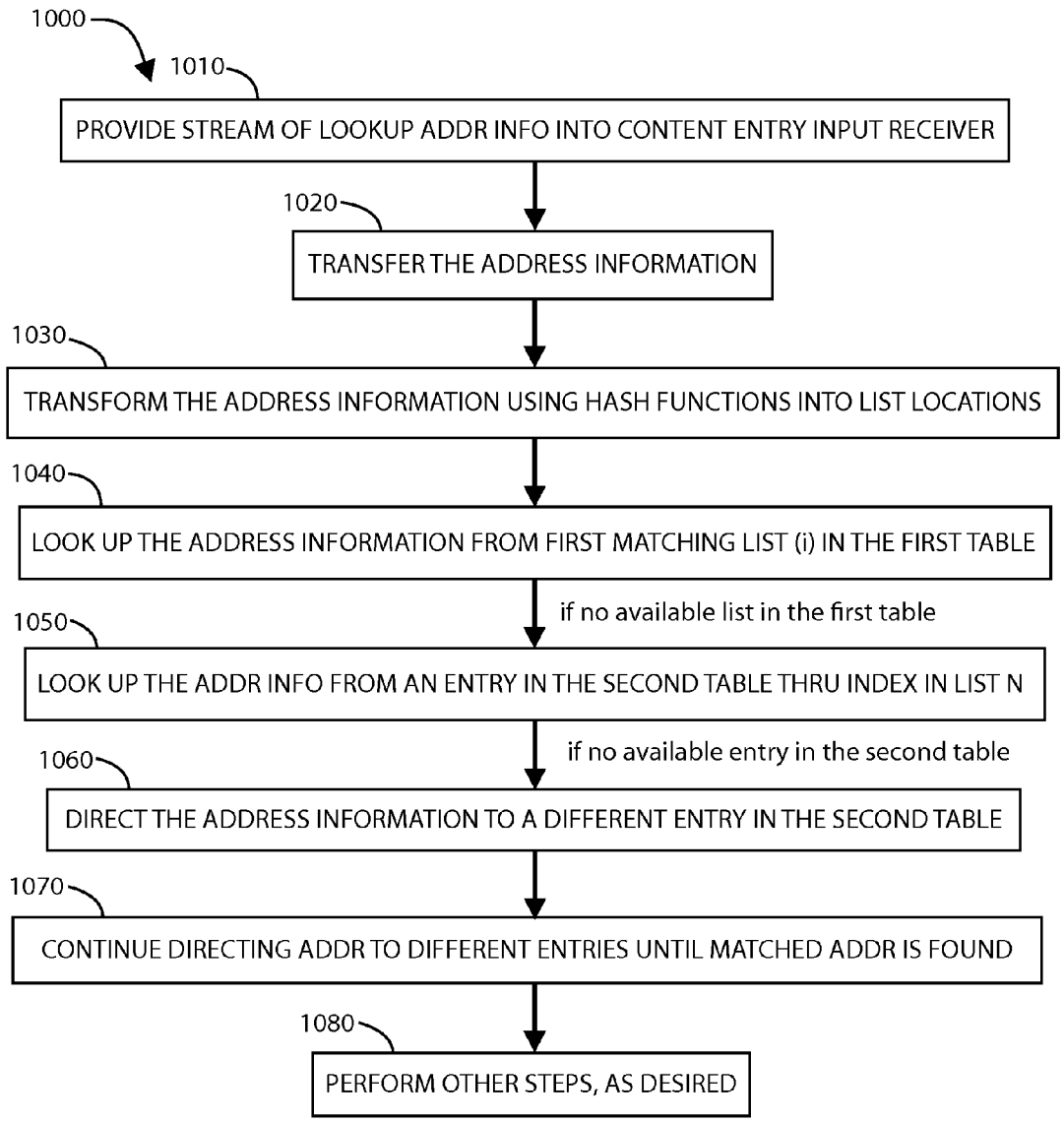
FIG. 10 illustrates a simplified flow diagram for operating the Address Match Table according to an embodiment of the present invention.

FIG. 10 illustrates a simplified flow diagram for operating the Address Match Table (AMT) according to an embodiment of the present invention. As shown, method 1000 represents a method of looking up and matching content entries in the AMT. In an example, this method 1000 for operating a memory interface device including an address match table with a first and second table is outlined below.

1. Provide an address information to be looked up into a content entry input receiver; (step 1010)
2. Transfer the address information; (step 1020)
3. Simultaneously transform the address information using a plurality of hash functions numbered from 1 through N, where N is an integer greater than 1, into a plurality of list locations numbered from 1 through N; (step 1030)
4. Look up the address information from a first matching list (i) that is the smallest (i) in a set of available lists numbered from 1 through N, or if no available lists exist in the first table, thereafter; (step 1040)
5. Look up the address information from an entry in the second table coupled to the first table through an index from list N that points from the first table to the second table, or if no available entry exists in the second table, thereafter; (step 1050)
6. Direct the address information to a different entry in the second table; (step 1060)
7. Continue the directing of the address information to another different entry in a successive manner until the matched address information is determined in the second table; (step 1070) and
8. Perform other steps, as desired. (step 1080)

In an embodiment, the AMT includes a content entry input, a plurality of hash functions, a first table, a second table, and an index, as described previously for FIGS. 7 and 8. The plurality of hash functions can be numbered from 1 through N, where N is an integer greater than 1. The first table, which is Table A, can include a plurality of lists numbered from 1 through N. Each has function (i) corresponds to a list (i), where (i) is a number in a set from 1 through N. The second table, which is Table B and includes a plurality of entries, can be coupled to the first table. Each of these entries can point to a different entry within the second table or a null entry in the second table. Furthermore, the index can be provided from list N in the first table that points to the second table. These regarding these elements and described previously for FIG. 9.

As shown, the present method has a sequence of steps, which can be varied, modified, replaced, reordered, expanded, contracted, or any combinations thereof. That is, the method repeats any of the above steps. Such steps may be performed alone or in combination with others, which are described or not even described. The steps can be performed in the order shown or in other orders, if desired. The steps also can be performed using a combination of hardware and software using other process steps. The steps also can be performed using hardware or other processes implemented using software and the like. Of course, there can be many other variations, modifications, and alternatives.

Various example embodiments as described with reference to the accompanying drawings, in which embodiments have been shown. This inventive concept may, however, be embodied in many different forms and should not be construed as limited to the embodiments set forth herein. Rather, these embodiments are provided so that this disclosure is thorough and complete, and has fully conveyed the scope of the inventive concept to those skilled in the art. Like reference numerals refer to like elements throughout this application.

It has been understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It has be understood that when an element is referred to as being "connected" or "coupled" to another element, it can be directly connected or coupled to the other element or intervening elements may be present. In contrast, when an element is referred to as being "directly connected" or "directly coupled" to another element, there may be no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It has been be further understood that terms, such as those defined in commonly used dictionaries, should be interpreted as having a meaning that is consistent with their meaning in the context of the relevant art and will not be interpreted in an idealized or overly formal sense unless expressly so defined herein.

It should be understood that the description recited above is an example of the disclosure and that modifications and changes to the examples may be undertaken which are within the scope of the claimed disclosure. Therefore, the scope of the appended claims should be accorded the broadest interpretation so as to encompass all such modifications and similar arrangements, including a full scope of equivalents.

The invention claimed is:

1. A memory interface device comprising an address match table for replacement of a faulty memory cell for an integrated circuit device, the address match table comprising:
   a content entry input;
   a plurality of hash functions numbered from 1 through N, where N is an integer greater than 1, the hash functions derived from a set of N orthogonal Galois Field primitive polynomials;
   a first table comprising a plurality of lists numbered from 1 through N, each hash function (i) corresponds to a list (i), where (i) is a number in a set from 1 through N;
   a second table coupled to the first table, the second table comprising a plurality of entries, wherein each of the entries of the second table points to a different entry within the second table or a null entry in the second table; and
   an index from list N in the first table that points to the second table.

2. The device of claim 1 wherein the Galois Field primitive polynomials are configured using a logic gate circuitry comprising at least XOR logic gates.

3. The device of claim 1 wherein the content entry input receives address information comprising a bank/row address for a dynamic random access memory device.

4. The device of claim 1 wherein N is four (4).

5. The device of claim 1 wherein the first table comprising the number of lists is provided by a plurality of SRAM arrays, wherein each of the SRAM arrays numbered 1 through N corresponds to each of the numbered lists numbered from 1 through N.

6. The device of claim 1 wherein the second table is provided by an SRAM array, wherein each of the entries in the second table has four content entries and an index to a different entry or a null entry in the SRAM array.

7. The device of claim 1 wherein the first table is populated with a set of content entries.

8. A method for operating a memory interface device comprising an address match table with a first table and a second table, the method comprising:
   providing a stream of address information into a content entry input receiver;
   transferring the address information;
   simultaneously transforming the address information using a plurality of hash functions numbered from 1 through N, where N is an integer greater than 1, into a plurality of list locations numbered from 1 through N, wherein the hash functions are derived from a set of N orthogonal Galois Field primitive polynomials;
   populating the address information in to a first available list (i) that is the smallest (i) in a set of available lists numbered from 1 through N, or if no available lists exist in the first table, thereafter;
   populating the address information into an entry in the second table coupled to the first table through an index from list N that points from the first table to the second table, or if no available entry exists in the second table, thereafter;
   directing the address information to a different entry in the second table; and
   continuing the directing of the address information to another different entry in a successive manner until the address information is stored in the second table.

9. The method of claim 8 wherein the Galois Field primitive polynomials are configured using a logic gate circuitry comprising at least XOR logic gates.

10. The method of claim 8 wherein the content entry input receives address information comprising a bank/row address for a dynamic random access memory device.

11. The method of claim 8 wherein N is four (4).

12. The method of claim 8 wherein the first table comprising the number of lists is provided by a plurality of SRAM arrays, wherein each of the SRAM arrays numbered 1 through N corresponds to each of the number of lists numbered from 1 through N.

13. The method of claim 8 wherein the second table is provided by an SRAM array, wherein each of the entries in the second table has four content entries and an index to a different entry or a null entry in the SRAM array.

14. The method of claim 8 wherein the first table is populated with a set of content entries.

15. A method for operating a memory interface device comprising an address match table, the method comprising:
  providing an address information to be looked up into a content entry input receiver;
  transferring the address information;
  simultaneously transforming the address information using a plurality of hash functions numbered from 1 through N, where N is an integer greater than 1, into a plurality of list locations numbered from 1 through N, wherein the hash functions are derived from a set of N orthogonal Galois Field primitive polynomials;
  looking up the address information from a first matching list (i) that is the smallest (i) in a set of matching lists numbered from 1 through N, or if no matching lists exist in the first table, thereafter;
  looking up the address information from an entry in the second table coupled to the first table through an index from list N that points from the first table to the second table, or if no available entry exists in the second table, thereafter;
  directing the address information to a different entry in the second table; and
  continuing the directing of the address information to another different entry in a successive manner until the matched address information is determined in the second table.

16. The method of claim 15 wherein the Galois Field primitive polynomials are configured using a logic gate circuitry comprising at least XOR logic gates.

17. The method of claim 15 wherein the content entry input receives address information comprising a bank/row address for a dynamic random access memory device.

18. The method of claim 15 wherein N is four (4).

19. The method of claim 15 wherein the first table comprising the number of lists is provided by a plurality of SRAM arrays, wherein each of the SRAM arrays numbered 1 through N corresponds to each of the number of lists numbered from 1 through N.

20. The method of claim 15 wherein the second table is provided by an SRAM array, wherein each of the entries in the second table has four content entries and an index to a different entry or a null entry in the SRAM array.

21. The method of claim 15 wherein the first table is populated with a set of content entries.

* * * * *